US009513659B2

(12) United States Patent
Wang et al.

(10) Patent No.: US 9,513,659 B2
(45) Date of Patent: Dec. 6, 2016

(54) INTEGRATED CIRCUIT

(71) Applicants: GLOBAL UNICHIP CORPORATION, Hsinchu (TW); TAIWAN SEMICONDUCTOR MANUFACTURING CO., LTD., Hsin-Chu (TW)

(72) Inventors: Wen-Tai Wang, Hsinchu (TW); Shi-Hao Chen, Hsinchu (TW); Ming-Jing Ho, Hsinchu (TW)

(73) Assignees: GLOBAL UNICHIP CORPORATION, Hsinchu (TW); TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 23 days.

(21) Appl. No.: 14/717,094

(22) Filed: May 20, 2015

(65) Prior Publication Data
US 2015/0338877 A1    Nov. 26, 2015

(30) Foreign Application Priority Data
May 22, 2014    (TW) .............................. 103117847 A

(51) Int. Cl.
| *H03K 3/00* | (2006.01) |
| *G06F 1/10* | (2006.01) |
| *H03K 5/135* | (2006.01) |

(52) U.S. Cl.
CPC ................ *G06F 1/10* (2013.01); *H03K 5/135* (2013.01)

(58) Field of Classification Search
USPC ................ 327/165, 166, 291–299, 374, 178; 326/93–98; 716/6
See application file for complete search history.

(56) References Cited

U.S. PATENT DOCUMENTS

| 5,101,117 A | 3/1992 | Johnson et al. |
| 5,122,679 A * | 6/1992 | Ishii .......................... G06F 1/10 327/147 |
| 5,305,451 A | 4/1994 | Chao et al. |
| 5,420,544 A | 5/1995 | Ishibashi |
| 5,465,347 A | 11/1995 | Chao et al. |
| 5,880,612 A | 3/1999 | Kim |
| 5,990,719 A | 11/1999 | Dai et al. |
| 6,037,822 A | 3/2000 | Rao et al. |

(Continued)

OTHER PUBLICATIONS

Martin Saint-Laurent et al., "A Multi-PLL Clock Distribution Architecture for Gigascale Integration," Intel Corporation (Austin, Texas), Georgia Institute of Technology (Atlanta, Georgia), pp. 30-35.

(Continued)

*Primary Examiner* — Brandon S Cole
(74) *Attorney, Agent, or Firm* — WPAT, PC; Justin King

(57) ABSTRACT

An integrated circuit includes a main clock tree, a reference clock trunk, a reference clock buffer and a calibration circuit. The main clock tree transmits a main operation clock to an internal node via serially-coupled buffers to form a local clock at an internal node. The reference clock buffer transmits a main reference clock via the reference clock trunk to form a reference clock at a terminal node. The calibration circuit compares phases of the local clock and the reference clock to accordingly generate a control signal, so the main clock tree can adjust phase of the local clock according to the control signal.

18 Claims, 3 Drawing Sheets

(56) References Cited

U.S. PATENT DOCUMENTS

| | | | | |
|---|---|---|---|---|
| 6,075,832 A * | 6/2000 | Geannopoulos | ............ | G06F 1/10 327/149 |
| 6,204,713 B1 * | 3/2001 | Adams | ............ | G06F 1/10 327/293 |
| 6,316,981 B1 | 11/2001 | Rao et al. | | |
| 6,323,714 B1 | 11/2001 | Naffziger et al. | | |
| 6,429,714 B1 * | 8/2002 | Schultz | ............ | G06F 1/10 327/161 |
| 6,448,168 B1 | 9/2002 | Rao et al. | | |
| 6,538,957 B2 | 3/2003 | Magoshi | | |
| 6,630,855 B2 * | 10/2003 | Fayneh | ............ | G06F 1/10 327/291 |
| 6,653,883 B2 | 11/2003 | Schultz | | |
| 6,861,884 B1 * | 3/2005 | Nguyen | ............ | G06F 1/10 327/155 |
| 6,879,196 B2 | 4/2005 | Lutkemeyer | | |
| 6,897,699 B1 * | 5/2005 | Nguyen | ............ | G06F 1/10 327/295 |
| 6,943,610 B2 | 9/2005 | Saint-Laurent | | |
| 7,042,269 B2 | 5/2006 | Kao | | |
| 7,765,425 B1 * | 7/2010 | Searles | ............ | G06F 1/10 713/401 |
| 2006/0006917 A1 * | 1/2006 | Kao | ............ | G06F 1/10 327/292 |

OTHER PUBLICATIONS

Jeffrey G. Mueller et al., "Autonomous, Multilevel Ring Tuning Scheme for Post-Silicon Active Clock Deskewing Over Intra-Die Variations," IEEE Transactions on Very Large Scale Integration (VLSI) Systems, vol. 19, No. 6, Jun. 2011, pp. 973-986.

Arjun Kapoor et al., "A Novel Clock Distribution and Dynamic De-skewing Methodology," Department of EE, Texas A&M University (College Station, TX), Department of ECE, University of Colorado (Boulder, CO), Copyright 2004 IEEE, pp. 626-631.

* cited by examiner

US 9,513,659 B2

INTEGRATED CIRCUIT

This application claims the benefit of Taiwan Patent Application No. 103117847, filed May 22, 2014, the subject matter of which is incorporated herein by reference.

FIELD OF THE INVENTION

The present invention relates to an integrated circuit, and more particularly, to an integrated circuit for transmitting a reference clock via a reference clock trunk to correct clock skew.

BACKGROUND OF THE INVENTION

An integrated circuit, e.g., a die, a chip or an SOC (system on chip), etc., is one of the most essential hardware foundations of contemporary information society. Generally, an integrated circuit includes a plurality of circuit blocks, e.g., combinations of circuit cells and circuit units, gate arrays, various processing units, silicon intellectual properties (IP) circuits, interface circuits or embedded memories, etc. Different circuit blocks are located at different positions of a layout of an integrated circuit.

For allowing two circuit blocks at different positions of an integrated circuit to work in coordination with each other, the two circuit blocks should have synchronized clocks. Accordingly, the integrated circuit has a clock tree for transmitting a same main operation clock to the two circuit blocks via serially-coupled buffers. However, the clock tree is readily influenced by variations of fabricating process, power supply and operating temperature. Consequently, the clocks received by the two circuit blocks are actually not in synchronization with each other (have a phase difference between the received clocks), a clock skew therefore occurs.

To address the clock skew issue, a conventional technique attempts to form a clock tree by regularly symmetric routings. However, for implementing such technique, the circuit blocks of the integrated circuits must have regular shapes, sizes, positions and arrangements. Since modern integrated circuit has to implement diversified functions, it needs to adopt circuit blocks of different sizes, and these circuit blocks are difficult to be arranged regularly. Consequently, it is difficult for such technology to comply with design trends of modern integrated circuit.

In another conventional technique, a clock transmitted to a circuit block is sent back to a start point of the clock tree, such that clock skew may be corrected. However, such technique equivalently needs two clock trees; one of the two clock trees transmits the clock to the circuit block, and the other clock tree send the clock back from the circuit block. Therefore, such technology will dramatically increase hardware complexity, waste layout area, and consume additional operation power. Moreover, since the equivalent impedance of the two clock trees are different, accuracy of correction is impaired.

In still another conventional technique, an integrated circuit is equipped with two clock trees; one clock tree transmits a normal clock, and the other clock tree transmits a calibration clock; a phase of the normal clock may then be adjusted according to the phase difference between the normal clock and the calibration clock. However, since the two clock trees are influenced by variations due to fabricating process, power supply and operating temperature, it is difficult to correctly suppress the clock skew.

SUMMARY OF THE INVENTION

The present invention provides an integrated circuit (e.g., 10 in FIG. 1) capable of correcting clock skew, including a main clock tree (e.g., 12), a reference clock trunk (e.g., 20), a reference clock buffer (e.g., B0) and a calibration circuit (e.g., 24). The main clock tree may include a plurality of serially-coupled buffers (e.g., b[q0], b[q1] and b[k1]) for transmitting a main operation clock (e.g., CK) to a first internal node (e.g., m1), so as to form a first local clock (e.g., CK1) at the first internal node. The reference clock trunk may include a source node (e.g., n0) and a first terminal node (e.g., n1). The reference clock buffer may be coupled to with the source node, for transmitting (driving, transmitting) a main reference clock (e.g., CKR) to the first terminal node, so as to form a first reference clock at the first terminal node. The calibration circuit may have a first input terminal and a second input terminal (e.g., i1 and i2) respectively coupled to the first internal node and the first terminal node, for comparing phases of the first local clock and the first reference clock, and according generating a control signal (e.g., S1), such that the main clock tree may adjust phase of the first local clock according to the control signal.

In an embodiment, the integrated circuit may further include a terminal buffer (e.g., B1) coupled between the first terminal node and the second input terminal, for providing (driving) a first auxiliary reference clock (e.g., CKr1) according to the first reference clock, and the calibration circuit may be arranged to compare phases of the first local clock and the first auxiliary reference clock to according generate the control signal.

In an embodiment, the reference clock buffer may switch between a calibration mode and a normal mode. The reference clock buffer may be arranged to transmit the main reference clock to the first terminal node to form the first reference clock at the first terminal node in the calibration mode; also, the calibration circuit may be arranged to compare phases of the first local clock and the first reference clock to accordingly generate the control signal in the calibration mode. On the other hand, when the reference clock buffer is in the normal mode, the reference clock buffer may stop transmitting the main reference clock to the first terminal node, so as to stop forming the first reference clock (or the first auxiliary reference clock); also in the normal mode, the calibration circuit may stop comparing, and maintain (e.g., latch) the control signal of the calibration mode, such that the main clock tree may continuously control phase of the first local clock according to the control signal.

In an embodiment, a frequency of the first local clock in the normal mode may be higher than a frequency of the first reference clock in the calibration mode. In other words, in the calibration mode, the first reference clock transmitted by the reference clock trunk may be a slower clock of a lower frequency (longer clock cycle), and the calibration circuit may be arranged to compare with the low-frequency first reference clock. After the calibration mode is completed to switch to the normal mode, the main clock tree may resume high-speed operation for providing a first local clock of higher frequency to the first internal node.

In an embodiment, the main clock tree may further include a plurality of serially-coupled second buffers (e.g., b[q2], b[q3] and b[k2]) for transmitting the main operation clock to a second internal node (e.g., m2), so as to form a second local clock (e.g., CK2) at the second internal node. The reference clock trunk may further include a second terminal node (e.g., n2), and, in the calibration mode, the reference clock buffer may further transmit the main reference clock to the second terminal node, so as to form a second reference clock is at the second terminal node. The integrated circuit may further include a second calibration circuit (e.g., 26) having a third input terminal and a fourth input terminal (e.g., i3 and i4) respectively coupled to the second internal node and the second terminal node. In the calibration mode, the second calibration circuit may compare phases of the second local clock and the second reference clock, and accordingly generate a second control signal (e.g., S2), such that the main clock tree may further adjust phase of the second local clock according to the second control signal. In an embodiment, the reference clock trunk may cause phase of the second reference clock substantially equal to phase of the first reference clock; accordingly, when the main clock tree controls (adjusts) phases of the first local clock and the second local clock according to the control signals of the calibration circuit and the second calibration circuit, the second local clock may be synchronized to the first local clock, and thus clock skew between the first local clock and the second local clock may be suppressed.

In an embodiment, the first terminal node may be arranged close to the first internal node, and the second terminal node may be arranged close to the second internal node; for example, a position difference (e.g., a linear distance) between the first internal node and the first terminal node may be smaller than a position difference between the first internal node and the second internal node.

In an embodiment, there may be no buffer arranged between the source node and the first terminal node along the reference clock trunk, i.e., the reference clock trunk may bypass (may not have to include) any buffer and/or active element between the source node and the first terminal node. In an embodiment, a routing width of the reference clock trunk may be greater than a routing width of the main clock tree. In an embodiment, a routing of the reference clock trunk and a routing of the main clock tree may be formed by different conductive layers. In an embodiment, routing of the reference clock trunk and routing of the main clock tree may be formed by different conductive materials. For example, routing of the main clock tree may be formed by cooper metal layer, while the reference clock trunk may be formed by an aluminum pad layer or a thick metal layer. Because the reference clock trunk may be of wider routing width, thicker thickness and/or higher conductivity, delay between the main reference clock and the first reference clock may be reduced, delay between the main reference clock and the second reference clock may also be reduced, so as to enhance synchronization of the first reference clock and the second reference clock.

To adapt wider routing of the reference clock trunk, the reference clock buffer may be a buffer of stronger driving capability; for example, clock driving capability of the reference clock buffer may be designed stronger than that of each buffer of the main clock tree.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
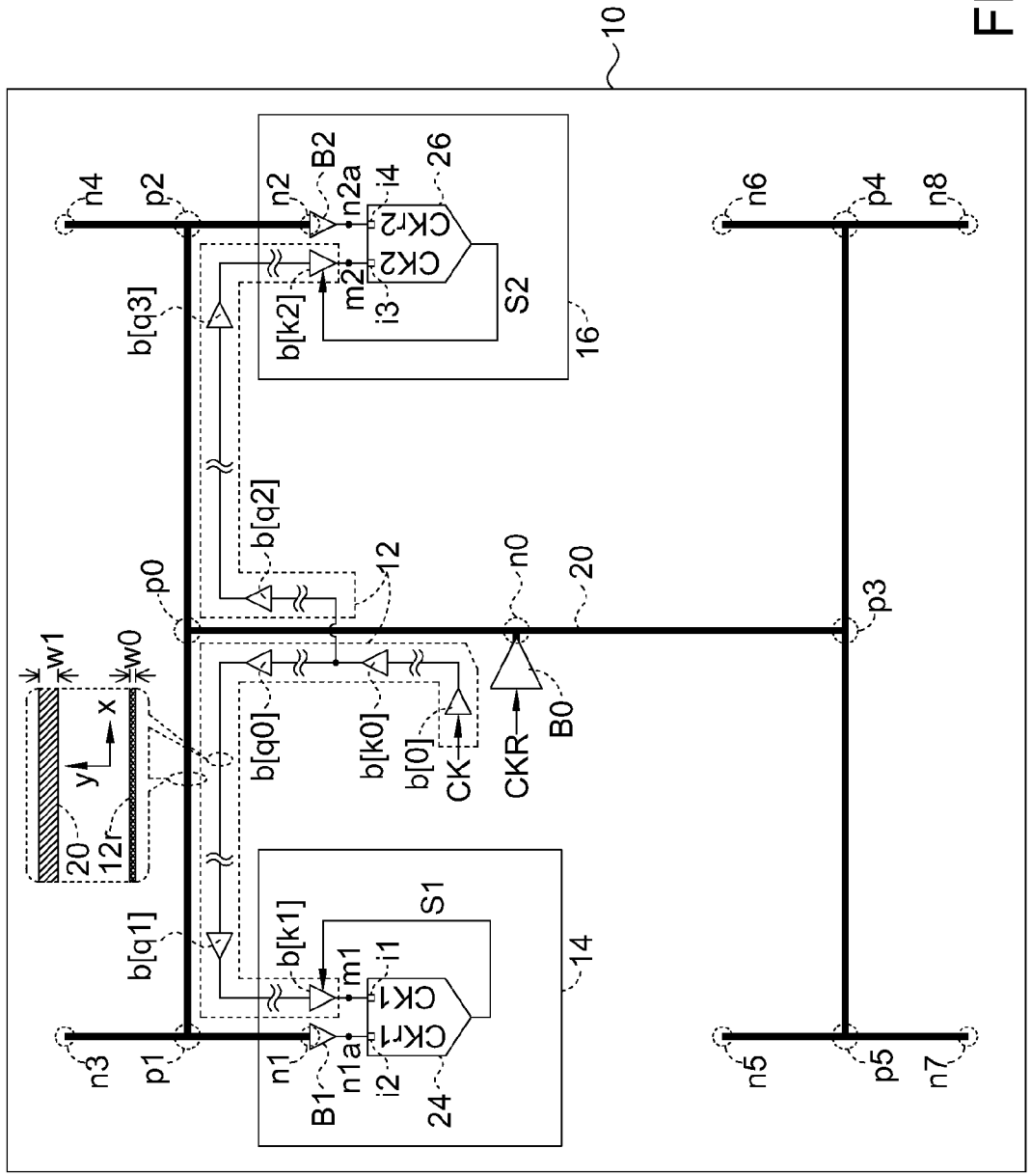
FIG. 1 schematically illustrates an integrated circuit according to an embodiment of the present invention.

Please refer to FIG. 1 schematically illustrating an integrated circuit 10 according to an embodiment of the present invention. For example, the integrated circuit 10 may be a die, a chip or an SOC (system on chip). In the example shown in FIG. 1, the integrated circuit 10 may include two circuit blocks 14 and 16 which are required to operate in synchronization with each other. To supply clocks to the two circuit blocks 14 and 16, the integrated circuit 10 may include a clock tree 12, as a main clock tree, for transmitting a clock CK (also referred to as a main operation clock) to the circuit blocks 14 and 16. The clock tree 12 may include a plurality of buffers and a plurality of routings between the buffers to be serially coupled to form paths for transmitting clocks. As shown in FIG. 1, the clock tree 12 may include serially-coupled buffers b[0], . . . , b[k0], . . . , b[q0], . . . , b[q1], . . . to b[k1] for transmitting the clock CK to a node m1 (also referred to as a first internal node) of the circuit block 14 to form a clock CK1 (also referred to as a first local clock) at the node m1, such that the circuit block 14 may operate according to triggering of the clock CK1. Similarly, in the example of FIG. 1, the clock tree 12 may further include another series of serially-coupled buffers b[0], . . . , b[k0], . . . , b[q2], . . . , b[q3], . . . to b[k2] for transmitting the clock CK to a node m2 (also referred to as a second internal node) of the circuit block 16 to form a clock CK2 (also referred to as a second local clock), such that circuit block 16 may operate according to triggering of the clock CK2.

To make the two circuit blocks 14 and 16 operate in synchronization, a phase difference between the clocks CK1 and CK2 has to be zero (or smaller than a tolerated value); in other words, the clock tree 12 should cause a delay between the clocks CK and CK1 equal to a delay between the clocks CK and CK2. However, as mentioned above, operation of the clock tree 12 may be affected by variations of fabricating process, power supply and operating temperature, it may therefore be difficult to keep the delay between the clocks CK and CK1 equal to the delay between the clocks CK and CK2; consequently, there may be a non-negligible phase difference between the clocks CK1 and CK2, i.e., a clock skew. Moreover, for increasing efficiency of energy utilization, circuit block of modern integrated circuit may switch to operate at different operation voltages and/or switch to operate in different operation modes, such as a normal mode and an idle mode. When a circuit block switches to operate at different voltages and/or in different operation modes, clock synchronization may also be influenced.

To suppress clock skew, the integrated circuit 10 of the invention may further include a clock calibration system, which may include a buffer B0 and a clock trunk 20, along with a calibration circuit and a terminal buffer for each circuit block required to be synchronized, such as a calibration circuit 24 and a terminal buffer B1 for the circuit block 14, and a calibration circuit 26 and a terminal buffer B2 for the circuit block 16. The clock trunk 20 is a reference clock trunk, which may extend from a node n0 (also referred to as a source node) to each circuit block which requires to be synchronized; e.g., to a node n1 (a first terminal node) associated with the circuit block 14, and to a node n2 (a second terminal node) associated with the circuit block 16. Different from the clock tree 12, the clock trunk 20 may be simply formed by routings, and may not need to include (may bypass) any active circuit and buffer. As shown in the example of FIG. 1, the clock trunk 20 does not have to include any buffer between the nodes n0 and n1; similarly, the clock trunk 20 does not have to pass any buffer between the nodes n0 and n2.

As shown in the example of FIG. 1, the clock trunk 20 may be an H-shaped trunk which may vertically branch from the node n0 to two nodes p0 and p3, horizontally branch from the node p0 to two nodes p1 and p2, horizontally branch from the node p3 to two nodes p4 and p5, vertically branch from the node p1 to the two nodes n1 and n3, vertically branch from the node p2 to the two nodes n2 and n4, vertically branch from the node p4 to two nodes n6 and n8, and vertically branch from the node p5 to two nodes n5 and n7. Since the circuit blocks 14 and 16 have to be synchronized, a routing length of the clock trunk 20 from the nodes n0, p0, p1 to n1 may equal a routing length of the clock trunk 20 from the nodes n0, p0, p2 to n2. It should be understood that the routing distribution shape of the clock trunk 20 is not restricted to the H shape; the clock trunk 20 may distribute according to other shape.

In the circuit block 14, the buffer B1 may be coupled between the node n1 and another node n1a; the calibration circuit 24 may have two input terminals i1 and i2 respectively coupled to the nodes m1 and n1a. In the circuit block 16, the buffer B2 may be coupled between the node n2 and another node n2a; the calibration circuit 26 may have two input terminals i3 and i4 respectively coupled to the nodes m2 and n2a. The routing distribution of the clock trunk 20 may be arranged to cause the node n1 to be positioned close to the node m1, and to cause the node n2 to be close to the node m2; for example, a position difference between the nodes m1 and n1 may be much smaller than a position difference between the nodes m1 and m2. As a result, the node n1a may be close to the node m1; similarly, position of the node n2a may therefore be close to the node m2.

In cooperation with the clock trunk 20, the buffer B0 may work as a reference clock buffer coupled to the node n0 of the clock trunk 20, and may switch between a calibration mode and a normal mode. When the buffer B0 operates in the calibration mode, it may drive a clock CKR (main reference clock) to be relayed to the nodes n1 and n2 via the clock trunk 20; because the routing length from the nodes n0 to n1 may equal the routing length from the nodes n0 to n2, driving of the buffer B0 may form two synchronized clocks (i.e., a first reference clock and a second reference clock, not shown) respectively at the nodes n1 and n2. In the calibration mode, the buffer B1 may further drive the clock at the node n1 to form a clock CKr1 (a first auxiliary reference clock) at the node n1a, and the buffer B2 may further drive the clock at the node n2 to form a clock CKr2 (second auxiliary reference clock) at the node n2a. The buffers B1 and B2 may be matched; with the two clocks at the nodes n1 and n2 being synchronized, the clocks CKr1 and CKr2 respectively at the nodes n1a and n2a will also be synchronized; e.g., a phase difference between the clocks CKr1 and CKr2 may be zero or less than a tolerated value.

In the calibration mode, the calibration circuit 24 may compare phases of the clocks CKr1 and CK1, and accordingly generate a control signal S1, such that the clock tree 12 may adjust phase of the clock CK1 according to the control signal S1; for example, the buffer b[k1] in the clock tree 12 may be a programmable buffer which may change a delay of the clock CK1 according to the control signal S1. Similarly, in the calibration mode, the calibration circuit 26 may compare phases of the clocks CKr2 and CK2, and accordingly generate a control signal S2, so the clock tree 12 may adjust phase of the clock CK2 according to the control signal S2. For example, the buffer b[k2] of the clock tree 12 may be a programmable buffer, which may changes a delay of the clock CK2 according to the control signal S2. Because the two clocks CKr1 and CKr2 of the clock trunk 20 are synchronized with each other, and phases of the clocks CK1 and CK2 are respectively adjusted according to the clocks CKr1 and CKr2 under control of the calibration circuits 24 and 26, the clocks CK1 and CK2 supplied to the circuit blocks 14 and 16 by the clock tree 12 may therefore be maintained in synchronization, so as to suppress the clock skew between the clocks CK1 and CK2.

In the calibration mode, when adjustment of the clocks CK1 and CK2 by the clock tree 12 has caused the clocks CK1 and CK2 in synchronization, the buffer B0 may stop the calibration mode and enter the normal mode. In the normal mode, the buffer B0 may be disabled to stop operation; i.e., the buffer B0 may stop driving the clock CKR to each node (including the nodes n1 and n2) of the clock trunk 20; the buffers B1 and B2 may also disabled, no longer drive the clocks CKr1 and CKr2 at the nodes n1a and n2a. In the normal mode, the calibration circuits 24 and 26 may also stop comparison, and may maintain (e.g., latch) the control signals S1 and S2 generated when the calibration mode ends; thus, the clock tree 12 may continue to control the phases of the clocks CK1 and CK2 according to the last control signals S1 and S2 generated at termination of the calibration mode, such that the clocks CK1 and CK2 may continuously be kept synchronized during the normal mode. In an embodiment, during the normal mode, the clock tree 12 may control phase of the clock CK1 according to a derived control signal S1'=S1−Soffset (not shown), and control phase of the clock CK2 according to a derived control signal S2'=S2−Soffset (not shown), while the term Soffset is a signal offset which may equal to a statistical result of the control signals S1 and S2. For example, the signal offset may equal a mean, a maximum or a minimum of the control signals S1 and S2. In the calibration mode, when clocks of the circuit blocks 14 and 16 are not calibrated, the circuit blocks 14 and 16 may pause normal operations; after the calibration mode is completed to switch to the normal mode, the circuit blocks 14 and 16, and even the entire integrated circuit 10, may restore normal operations.

The integrated circuit 10 may periodically switch from the normal mode to the calibration mode to calibrate the clock skew between the clocks CK1 and CK2 for the circuit blocks 14 and 16 demanding synchronization. For example, a cycle for the integrated circuit 10 switching to the calibration mode may be several microseconds to several milliseconds; in each cycle, the calibration mode is entered once, so as to maintain the local clocks demanding synchronization. And/or, when the circuit blocks requiring synchronization enter idle intervals and thus do not need to operate, the integrated circuit 10 may also switch to the calibration mode to recalibrate clocks of circuit blocks during the idle intervals; for example, many circuit blocks related to communication have idle intervals during which signal transmitting and/or receiving are paused. And/or, when circuit blocks demanding synchronization switch operation mode and/or voltage, the calibration mode may be reentered to recalibrate clocks demanding synchronization. For example, the circuit block 14 may be a voltage island which may switch to operate at different operation voltages; when the circuit block 14 switches operation voltage, the synchronization of the clock CK1 may be influenced, so the calibration mode may executed again for recalibration.

As shown in FIG. 1, assume the routing of the clock trunk 20 extends along an x-axis, then the cross-section dimension of the routing along a y-axis may be regarded as a width w1 of the routing; similarly, assume a routing 12r between buffers of the clock tree 12 extends along the x-axis, a cross-section dimension of the routing along the y-axis may be regarded as a width w0 of the routing 12r, and a dimension along a z-axis (not shown) may be regarded as a thickness of the routing 12r. In an embodiment of the invention, the routing width w1 of the clock trunk 20 may be greater than the routing width w0 of the clock tree 12. Because the routing width of the clock trunk 20 is wider, electrical resistance of clock propagation path is lower, clock delay is thus smaller, and it becomes easier to form the synchronized clocks CKr1 and CKr2 at the different nodes n1 and n2. And/or, the routing thickness of the clock trunk 20 may be greater than the routing thickness of the clock tree 12.

In an embodiment of the invention, routing of the clock trunk 20 and routing of the clock tree 12 are formed by different conductive layers; and/or, routing of the clock trunk 20 and routing of the clock tree 12 may be formed by different conductive materials. For example, routing of the clock tree 12 may be formed by a lower (closer to substrate, not shown) cooper interconnection metal layer, while routing of the clock trunk 20 may be formed by a higher aluminum pad layer (AP layer) or a thick metal layer (with thickness greater than the metal layer of the clock tree 12). That is, the buffer B0 formed at the substrate may be conducted upwardly to the higher-layer clock trunk 20 through conductive via(s) at the node n0, conducted to the nodes n1 and n2 by the clock trunk 20, and then conducted downwardly at the nodes n1 and n2 to the buffers B1 and B2 lower at the substrate. Because resistance per unit area of the aluminum pad layer is less than that of the copper layer, the aluminum pad layer has better electrical conductivity, and clock propagation path along the clock trunk 20 has lower parasitic resistance. Because the clock trunk 20 may have wider routing width, thicker routing thickness and/or better electrical conductivity, delay between the clocks CKR and CKr1 and delay between the clocks CKR and CKr2 may be effectively reduced, so as to enhance synchronization of the clocks CKr1 and CKr2.

For the wider routing of the clock trunk 20, the buffer B0 for driving clock propagation along the clock trunk 20 may be a buffer with higher current driving capability; for example, clock driving capability of the buffer B0 may be stronger than that of each buffer of the clock tree 12, e.g., the buffers b[0], b[k1] and b[k2], etc. Because the buffer B0 may only be enabled in the calibration mode and may not have to be enabled in the normal mode, power consumption of the buffer B0 may be very low.

In an embodiment of the invention, when the integrated circuit 10 operates in the calibration mode, the source clock CKR of the clock trunk 20 and the source clock CK of the clock tree 12 may be derived from a same base clock (e.g., an externally provided precise clock, not shown), so that the two clocks CKR and CK may be in synchronization with each other; the clocks CKR and CK may also be the same clock. A location where the clock CK feeds to the buffer b[0] may be close to a location where the clock CKR feeds to the buffer B0.

In an embodiment of the invention, to match the wider routing of the clock trunk 20, the clock CK may slow down to a clock of lower frequency (longer clock cycle) during the calibration mode, and the clock CKR may also be a slower clock as the clock CK, so the buffer B0 may drive the clock CKR to the terminal nodes n1 and n2 of the clock trunk 20 more easily; the calibration circuit 24 compares the clocks CKr1 and CK1 of lowered frequency, and the calibration circuit 26 compares the clocks CKr2 and CK2 of lowered frequency. After the calibration mode is completed and switched to the normal mode, the clock CK may speed up to a clock of higher frequency, so the circuit blocks 14 and 16 may operate at high clock rate according to the high-frequency clocks CK1 and CK2. In other words, during the normal mode, the source clock CK of the clock tree 12 and the local clocks CK1 and CK2 supplied to the circuit blocks 14 and 16 may all be high-frequency clocks; on the other hand, during the calibration mode, the clocks CK, CK1 and CK2 of the clock tree 12 may all slow down to low-frequency clocks, so as to match the low-frequency clocks CKR, CKr1 and CKr2 of the clock trunk 20 for calibrating clock skew according to the clocks CKr1 and CKr2. In an embodiment, during the normal mode, the clock CKR may stop toggling.

In an embodiment of the invention, the terminal buffers B1 and B2 of the clock trunk 20 may be omitted; that is, the nodes n1 and n1a may combine to a same node and be directly connected to the input terminal i2 of the calibration circuit 24; Similarly, the nodes n2 and n2a may combine as one and be directly connected to the input terminal i4 of the calibration circuit 26.

In an embodiment of the invention, each calibration circuit 24 (or 26) may include a phase detector and a filter (not shown); the phase detector may detect a phase difference between the clocks CK1 and CKr1, and accordingly provide a detection signal; the filter may perform long-term accumulation of the detection signal and accordingly provide the control signal S1.

Figure 2:
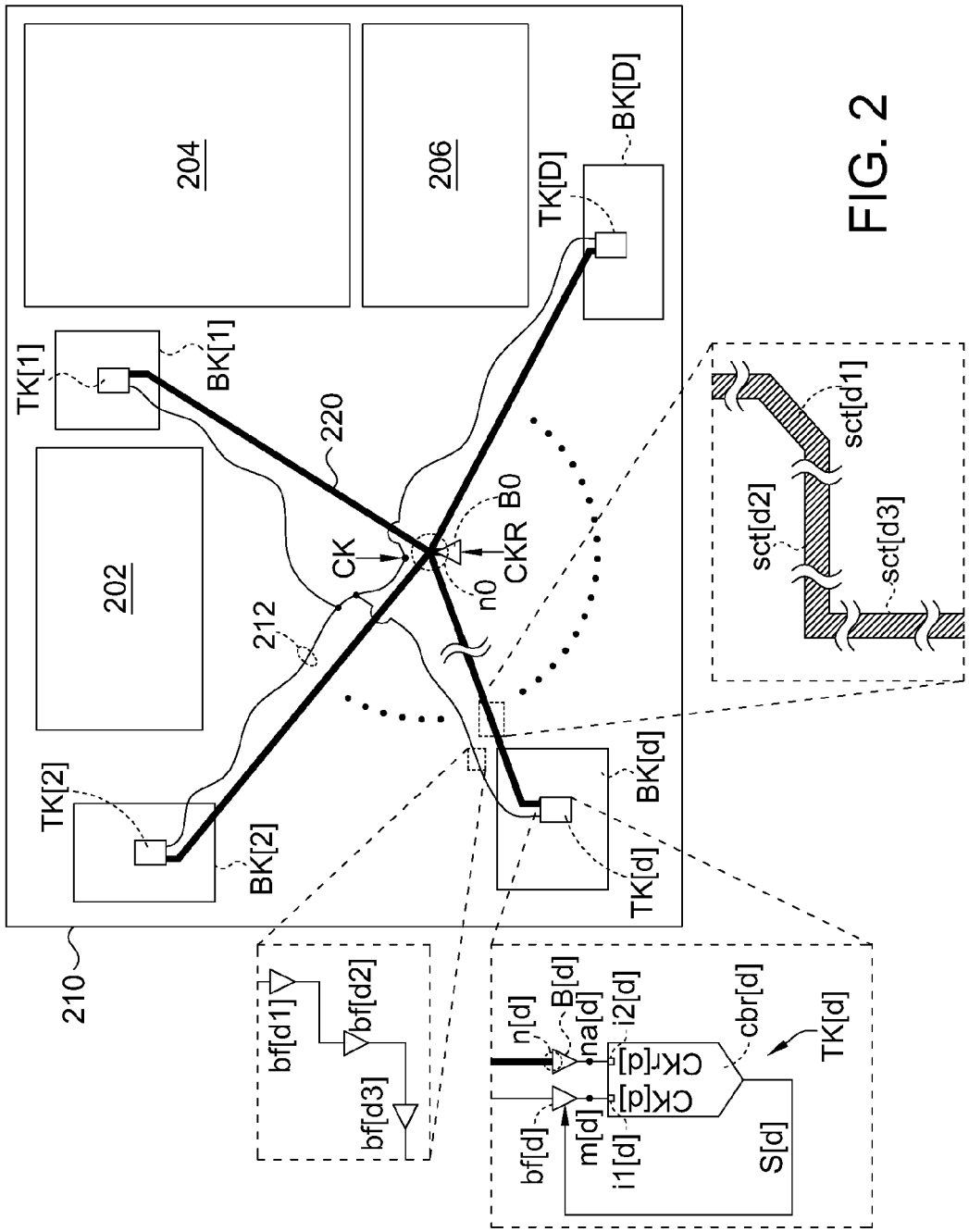
FIG. 2 schematically illustrates an integrated circuit according to another embodiment of the present invention.

Please refer to FIG. 2 schematically illustrating an integrated circuit 210 according to another embodiment of the present invention. The integrated circuit 210 may include three circuit blocks 202, 204 and 206, and an amount D of circuit blocks BK[1], BK[2], . . . , to BK[D] which are required to be synchronized, wherein the amount D may be greater than or equal to 2. In the integrated circuit 210, the circuit blocks 202, 204 and 206 may be macro circuit blocks which occupy large layout areas; for example, the circuit blocks 202, 204 and 206 may be embedded static random access memories (SRAMs). For accommodating the circuit blocks 202, 204 and 206, the circuit blocks from BK[1] to BK[D] are dispersedly placed at the remaining fragmentary space.

Because the circuit blocks BK[1] to BK[D] need to be synchronized with each other, the integrated circuit 210 may be equipped with a clock tree 212 for transmitting a main operation clock CK to each circuit blocks BK[d] (for d=1 to D). Each circuit block BK[d] may be coupled to the clock tree 212 via a terminal circuit TK[d]; as shown in FIG. 2, the clock tree 212 may include a plurality of serially-coupled buffers, such as the buffers bf[d1], bf[d2], bf[d3] and bf[d], so the clock CK may be transmitted to a node m[d] in the terminal circuit TK[d] to form a local clock CK[d].

For correcting clock skew among the circuit blocks BK[1] to BK[D], the integrated circuit 210 may further include a clock calibration system, which may include a buffer B0 with high driving capability, a clock trunk 220, along with a terminal buffer B[d] and a calibration circuits cbr[d] in each terminal circuit TK[d] (for d=1 to D). The buffer B0 may be coupled to the clock trunk 220 at the node n0, and the clock trunk 220 may extend from the node n0 to a node n[d] of each terminal circuit TK[d]; the buffer B[d] may be coupled between the nodes n[d] and na[d]. The calibration circuit cbr[d] may have two input terminals i1[d] and i2[d] respectively coupled to the nodes m[d] and na[d].

Similar to the embodiment of FIG. 1, the clock trunk 220 may simply be routings, and may not have to include any buffer between the nodes n0 and n[d] (for d=1 to D). For different circuit blocks BK[d1] and BK[d2] (d1 not equal to d2), a routing length from the nodes n0 to n[d1] along the clock trunk 220 may equal a routing length from the nodes n0 to n[d2] along the clock trunk 220. As shown in FIG. 2, the routing of the clock trunk 220 from the nodes n0 to n[d] may be formed by combination of one or more vertical segments (e.g., segment sct[d3]), one or more horizontal segments (e.g., segment sct[d2]) and/or one or more oblique segments (e.g., segment sct[d1]). By combing segments of different directions and/or different lengths, the routing lengths from the node n0 to the nodes n[d1] and n[d2] may be arranged to equal. In comparison with routing of the clock tree 212, routing of the clock trunk 220 may be wider, and/or be formed by an aluminum pad layer of higher electrical conductivity.

Following operation principle of the embodiment shown in FIG. 1, the clock calibration system in FIG. 2 may also switch between a calibration mode and a normal mode. In the calibration mode, the buffer B0 may be enabled to operate, so as to drive the clock CKR to the nodes n[d] of each circuit blocks BK[d] via the clock trunk 220; the buffer B[d] may drive the clock at the node n[d] to form a clock CKr[d] at the node na[d]. The calibration circuit cbr[d] may compare phases of the clocks CKr[d] and CK[d], and accordingly generate a control signal S[d]. The buffer bf[d] of the clock tree 212 may be a delay-programmable buffer controlled by the control signal S[d], so as to control phase of the clock CK[d] according to the control signal S[d] based on comparison of the clocks CK[d] and CKr[d]. For different circuit blocks BK[d1] and BK[d2] (d1 not equal to d2), phases of the clocks CKr[d1] and CKr[d2] relayed by the clock trunk 220 are identical; therefore, when the clocks CK[d1] and CK[d2] of the clock tree 212 are respectively compared with the clocks CKr[d1] and CKr[d2], the clocks CK[d1] and CK[d2] are synchronized with each other naturally, and the calibration mode may end to restore the normal mode, so the integrated circuit 210 may continue normal operation, while the buffer B0 and the terminal buffer B[d] may stop operating. In an embodiment, during the normal mode, the clock tree 212 may control phase each clock CK[d] according to a derived control signal S[d]'=S[d]−Soffset (not shown), while the term Soffset is a signal offset which may equal to a statistical result of all the control signals S[1] to S[D]. For example, the signal offset may equal a mean, a maximum or a minimum of the control signals S[1] to S[D].

As shown by the embodiment of FIG. 2, though the circuit blocks BK[1] to BK[D] demanding synchronization may be irregularly and dispersedly located at the remaining fragmentary space of the integrated circuit 210, clock skew among these circuit blocks may still be effectively corrected according to the invention.

Figure 3:
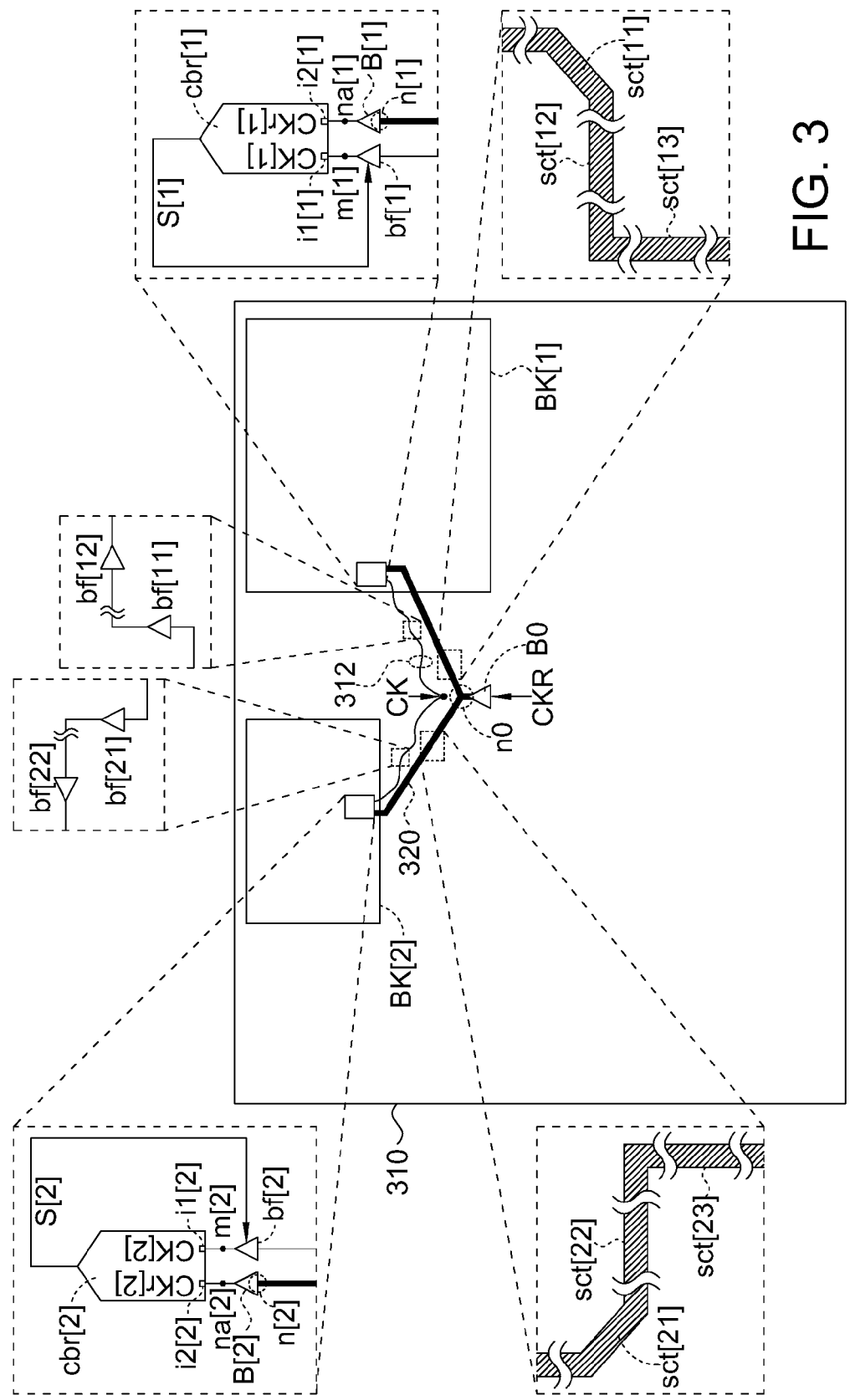
FIG. 3 schematically illustrates an integrated circuit according to a further embodiment of the present invention.

Please refer to FIG. 3 schematically illustrating an integrated circuit 310 according to an embodiment of the present invention. The integrated circuit 310 may include two circuit blocks BK[1] and BK[2] which requires to be synchronized; for example, the circuit blocks BK[1] and BK[2] may be two voltage islands that adopt different operation voltages. The integrated circuit 310 may also be equipped with a clock tree 312 for transmitting a main operation clock CK to the circuit blocks BK[1] and BK[2]. As shown in FIG. 3, the clock tree 312 may include a plurality of serially-coupled buffers, such as the buffers bf[11], bf[12] to bf[1], for transmitting the clock CK to a node m[1] of the circuit block BK[1] to form a local clock CK[1]; similarly, the clock tree 312 may further include another plurality of serially-coupled buffers, such as the buffers bf[21], bf[22] to bf[2], for transmitting the clock CK to a node m[2] of the circuit block BK[2] as a local clock CK[2].

For correcting clock skew between the circuit blocks BK[1] and BK[2], the integrated circuit 310 may further include a clock calibration system, which may include a buffer B0 of high driving capability, a clock trunk 320, along with a buffer B[1] and a calibration circuit cbr[1] associated with the circuit block BK[1], and a buffer B[2] and a calibration circuit cbr[2] associated with the circuit block BK[2]. The buffer B0 may be coupled to the clock trunk 320 at the node n0. The clock trunk 320 may extend from the node n0 to a node n[1] of the circuit block BK[1], and to a node n[2] of the circuit block BK[2]. The buffer B[1] may be coupled between the nodes n[1] and na[1], and the buffer B[2] may be coupled between the nodes n[2] and na[2]. The calibration circuit cbr[1] may have two input terminals i1[1] and i2[1] respectively coupled to the nodes m[1] and na[1]. The calibration circuit cbr[2] may have two input terminals i1[2] and i2[2] respectively coupled to the nodes m[2] and na[2].

Similar to the embodiments of FIGS. 1 and 2, the clock trunk 320 may simply be formed by pure routings, and may not have to include any buffer from the nodes n0 to n[1] and from the nodes n0 to n[2]. For the circuit blocks BK[1] and BK[2], a routing length from the nodes n0 to n[1] along the clock trunk 320 may equal a routing length from the nodes n0 to n[2] along the clock trunk 320. As shown in FIG. 3, routing of the clock trunk 320 from the nodes n0 to n[1] may be formed by combination of one or more segments of same and/or different directions, such as vertical segment sct[13], horizontal segment sct[12] and tilted segment sct[11]. Similarly, routing of the clock trunk 320 from the nodes n0 to n[2] may be formed by combination of one or more segments of same and/or different directions, such as vertical segment sct[23], horizontal segment sct[22] and tilted segment sct[21]. Comparing to routing of the clock tree 312, routing of the clock trunk 320 may be wider, and/or formed by an aluminum pad layer of higher electrical conductivity.

Following the operation principles of the embodiments of FIGS. 1 and 2, the clock calibration system of the integrated circuit 310 of FIG. 3 may switch between a calibration mode and a normal mode. During the calibration mode, the buffer B0 may be enabled to operate, and drive the clock CKR to the node n[1] of the circuit block BK[1] and the node n[2] of the circuit block BK[2] via the clock trunk 320. The buffer B[1] may drive the clock at the node n[1] to form a clock CKr[1] at the node na[1], and the buffer B[2] may drive the clock at the node n[2] to form a clock CKr[2] at the node na[2]. The calibration circuit cbr[1] may compare phases of the clocks CKr[1] and CK[1], and accordingly generate a control signal S[1]; the calibration circuit cbr[2] may compare phases of the clocks CKr[2] and CK[2] to accordingly generate a control signal S[2]. The buffers bf[1] and bf[2] of the clock tree 312 may be delay-programmable buffers controlled by the control signals S[1] and S[2], capable of control phases of the clocks CK[1] and CK[2], respectively. Because phases of the clocks CKr[1] and CKr[2] transmitted by the clock trunk 320 are identical, when phases of the clocks CK[1] and CK[2] of the clock tree 312 are respectively adjusted according to the clocks CKr[1] and CKr[2], the clocks CK[1] and CK[2] are synchronized with each other naturally, and therefore the calibration mode may end to restore the normal mode, such that the integrated circuit 310 may normally operate, while the buffer B0 and the terminal buffers B[1] and B[2] may cease operations. In an embodiment, during the normal mode, the clock tree 12 may control phase of the clock CK1 according to a derived control signal S1'=S1−Soffset (not shown), and control phase of the clock CK2 according to a derived control signal S2'=S2−Soffset (not shown), while the term Soffset is a signal offset which may equal to a statistical result of the control signals S1 and S2. For example, the signal offset may equal a mean, a maximum or a minimum of the control signals S1 and S2. Driving capability of the buffers B[1] and B[2] may be lower than that of the buffer B0.

According to the embodiment of FIG. 3, although the circuit blocks BK[1] and BK[2] demanding synchronization may be different voltage islands, their clock skew may still be effectively corrected according to the invention.

To sum up, comparing to prior arts, the invention adopts dedicated clock trunk of lower resistance, wider width and/or better conductivity to accurately relay reference clock of calibration, and accordingly correct clock skew of clock tree. Therefore, the invention benefits lower hardware complexity, higher precision, and may be broadly applied to various layouts of regular or irregular placements.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An integrated circuit, comprising:
   a main clock tree comprising a plurality of serially-coupled buffers for transmitting a main operation clock to a first internal node, so as to form a first local clock at the first internal node;
   a reference clock trunk comprising a source node and a first terminal node;
   a reference clock buffer coupled to the source node, wherein the reference clock buffer switches between a calibration mode and a normal mode; the reference clock buffer transmits a main reference clock to the first terminal node to form a first reference clock at the first terminal mode in the calibration mode; and when the reference clock buffer is in the normal mode, the reference clock buffer stops transmitting the main reference clock to the first terminal node; and
   a calibration circuit having a first input terminal and a second input terminal respectively coupled to the first internal node and the first terminal node, for comparing phases of the first local clock and the first reference clock and accordingly generating a control signal, such that the main clock tree adjusts phase of the first local clock according to the control signal.

2. The integrated circuit as claimed in claim 1 further comprising:
   a terminal buffer coupled between the first terminal node and the second input terminal, for driving a first auxiliary reference clock according to the first reference clock, wherein the calibration circuit is arranged to compare phases of the first local clock and the first auxiliary reference clock to accordingly generate the control signal.

3. The integrated circuit as claimed in claim 1, wherein there is no buffer arranged between the source node and the first terminal node along the reference clock trunk.

4. The integrated circuit as claimed in claim 1, wherein the calibration circuit is arranged to compare phases of first local clock and the first reference clock to according generate the control signal in the calibration mode; when the reference clock buffer is in the normal mode, the calibration circuit stops comparing and maintains the control signal of the calibration mode.

5. The integrated circuit as claimed in claim 1, wherein a frequency of the first local clock in the normal mode is higher than a frequency of the first reference clock in the calibration mode.

6. The integrated circuit as claimed in claim 1, wherein the reference clock trunk is formed by an aluminum pad layer or a thick metal layer.

7. The integrated circuit as claimed in claim 1, wherein a routing width of the reference clock trunk is greater than a routing width of the main clock tree.

8. The integrated circuit as claimed in claim 1, wherein:
   the main clock tree further comprises a plurality of serially-coupled second buffers for transmitting the main operation clock to a second internal node, so as to form a second local clock at the second internal node;
   the reference clock trunk further comprises a second terminal node; and
   the reference clock buffer further transmits the main reference clock to the second terminal node, so as to form a second reference clock at the second terminal node;
   wherein the integrated circuit further comprises:
   a second calibration circuit having a third input terminal and a fourth input terminal respectively coupled to the second internal node and the second terminal node, for comparing phases of the second local clock and the second reference clock and according generating a second control signal, such that the main clock tree adjusts phase of the second local clock according to the second control signal.

9. The integrated circuit as claimed in claim 8, wherein the reference clock trunk causes phase of the second reference clock substantially equal to phase of the first reference clock.

10. The integrated circuit as claimed in claim 8, wherein a position difference between the first internal node and the first terminal node is smaller than a position difference between the first internal node and the second internal node.

11. The integrated circuit as claimed in claim 1, wherein a routing of the reference clock trunk and a routing of the main clock tree are formed by different conductive layers.

12. The integrated circuit as claimed in claim 1, wherein a routing of the reference clock trunk and a routing of the main clock tree are formed by different conductive materials.

13. An integrated circuit, comprising:
a main clock tree comprising a plurality of serially-coupled buffers for transmitting a main operation clock to a first internal node, so as to form a first local clock at the first internal node;
a reference clock trunk comprising a source node and a first terminal node;
a reference clock buffer coupled to the source node, and capable of operating in a calibration mode and in a normal mode;
a calibration circuit having a first input terminal and a second input terminal respectively coupled to the first internal node and the first terminal node;
wherein when the reference clock buffer operates in the calibration mode, the reference clock buffer transmits a main operation clock to the first terminal node to form a first reference clock at the first terminal node, and the calibration circuit compares phases of the first local clock and the first reference clock and accordingly generates a control signal;
wherein when the reference clock buffer operates in the normal mode, the reference clock buffer stops transmitting the main reference clock, so as to stop forming the first reference clock, and the calibration circuit stops comparing, and maintains the control signal of the calibration mode,
wherein the main clock tree further adjusts phase of the first local clock according to the control signal.

14. The integrated circuit as claimed in claim 13, wherein a frequency of the first local clock in the normal mode is higher than a frequency of the first reference clock in the calibration mode.

15. The integrated circuit as claimed in claim 13, wherein the reference clock trunk is formed by an aluminum pad layer or a thick metal layer.

16. The integrated circuit as claimed in claim 13, wherein a routing width of the reference clock trunk is greater than a routing width of the main clock tree.

17. The integrated circuit as claimed in claim 13, wherein a routing of the reference clock trunk and a routing of the main clock tree are formed by different conductive layers.

18. The integrated circuit as claimed in claim 13, wherein a routing of the reference clock trunk and a routing of the main clock tree are formed by different conductive materials.

* * * * *